United States Patent [19]

Matsuoka et al.

[11] Patent Number: 5,352,124
[45] Date of Patent: Oct. 4, 1994

[54] SOCKET FOR IC PACKAGE

[75] Inventors: Noriyuki Matsuoka, Yokohama; Eisaku Tsubota, Kawasaki, both of Japan

[73] Assignee: Yamaichi Electronics Co., Ltd., Tokyo, Japan

[21] Appl. No.: 67,002

[22] Filed: May 26, 1993

[30] Foreign Application Priority Data

May 27, 1992 [JP] Japan .................. 4-160307

[51] Int. Cl.$^5$ .......................................... H01R 23/72
[52] U.S. Cl. ...................................... 439/70; 439/525
[58] Field of Search ............... 439/68, 70, 71, 72, 439/73, 525, 526

[56] References Cited

U.S. PATENT DOCUMENTS

| Re. 31,929 | 6/1985 | Donaher et al. | 439/70 |
| 3,999,827 | 12/1976 | Hutchison et al. | 439/71 |
| 4,252,390 | 2/1981 | Bowling | 439/73 |
| 4,614,387 | 9/1986 | Hartl | 439/70 |
| 4,746,299 | 5/1988 | Matsuoka et al. | 439/70 |

*Primary Examiner*—Gary F. Paumen
*Assistant Examiner*—Hien D. Vu
*Attorney, Agent, or Firm*—Wenderoth, Lind & Ponack

[57] ABSTRACT

A socket for an IC package includes a plurality of contacts arranged in array in such a manner as to correspond to a plurality of IC leads of an IC package. Each of the contacts comprises a first unitary contact extending to a lower surface portion of each of the unitary IC leads so as to be brought into pressure contact with the lower surface portion, and a second unitary contact extending to a side surface portion of the lead so as to be brought into pressure contact with the side surface portion. The first and second unitary contacts have male terminals separately connected to a wiring board, respectively.

19 Claims, 5 Drawing Sheets

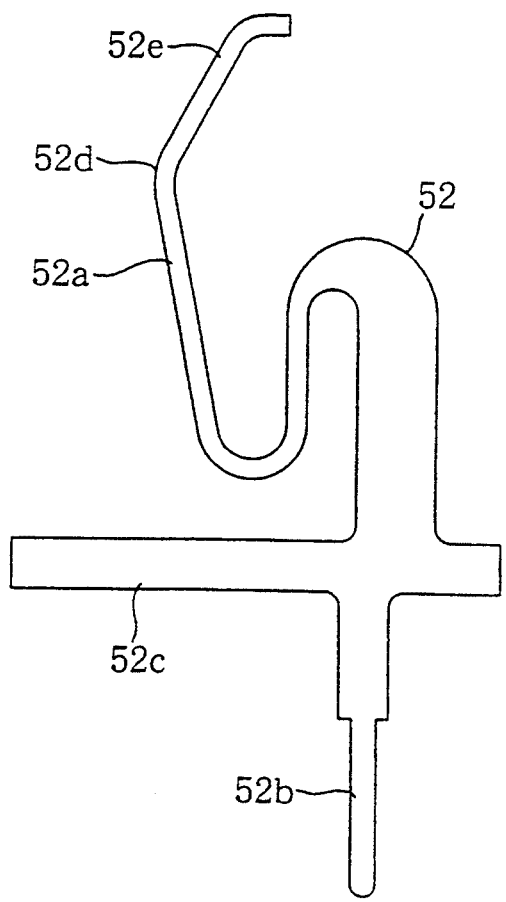
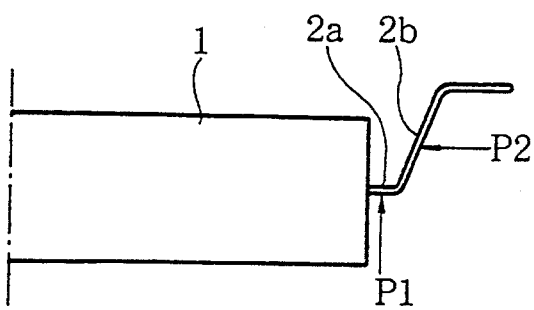
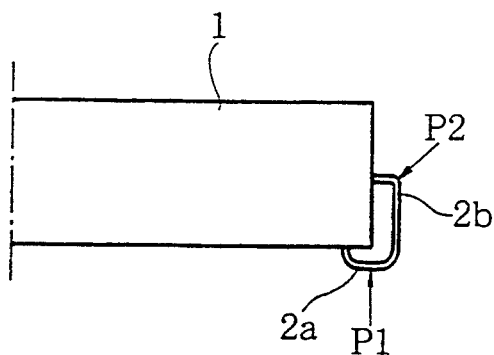
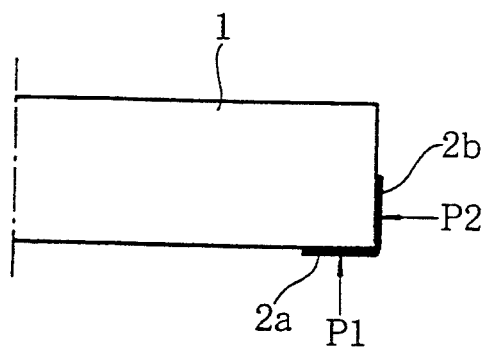

SOCKET FOR IC PACKAGE

BACKGROUND OF THE INVENTION

1. Field of the Invention

This invention relates to a socket for an IC package in which a plurality of unitary contacts are brought into contact with a single IC lead at a plurality of points.

2. Brief Description of the Prior Art

Generally, in an IC socket of the type mentioned above, an arrangement is such that a single contact is brought into contact with a single IC lead at one point. In the case of an IC package having DIP type leads or gull wing type leads, or in an IC package having J-bend type leads, the contacts are brought into contact with lower surface portions or side surface portions of the leads, respectively, when the IC package is inserted in the IC socket.

In order to ensure a reliable contact, there is proposed a socket for an IC package in which a single contact has a contact element capable of contacting a side surface portion of a lead and a contact element capable of contacting a lower surface portion of the lead.

However, in the socket for an IC package of the type in which a single contact is brought into contact with a single lead at one point, inferior or insufficient contact often arises due to error in bending dimension of the lead and/or due to foreign matter interfering with the contacting point. Particularly, as the requirement for arranging the IC leads at smaller pitches and making the IC leads in more minute shape progresses and the area of the contacting point becomes extremely limited, the above-mentioned problem of inferior contact becomes apparent. Furthermore, although the above contact is soldered to a through-hole of a wiring board at a male terminal projecting downwardly of the socket or is soldered to a wiring pattern of the wiring board at the male terminal, there is a possibility that the solder will deteriorate due to vibration and/or temperature, thereby resulting in inferior contact. A solution to this problem is needed.

If a single contact is provided with a contact element capable of contacting the lead at a plurality of points, the first-mentioned problem (that is, inferior contact between each contact and each IC lead) can be solved to some extent. However, it gives rise to the problems that design of one contact element limits design of the other contact elements, and the configuration of the contact becomes overly complicated. In addition, there still remains the second-mentioned problems that solder may deteriorate due to vibration and/or temperature, resulting in inferior contact.

SUMMARY OF THE INVENTION

It is therefore an object of the present invention to provide an arrangement which is not only capable of solving the first problem that inferior contact occurs between each IC lead and each contact and the second problem of inferior contact between the contact and a wiring board, but is also capable of ensuring a retaining force of an IC package.

To achieve the above object, there is provided a socket for an IC package including a plurality of contacts arranged in array in such a manner as to correspond to a plurality of IC leads of an IC package. Each of the contacts comprises a first unitary contact extending to a lower surface portion of each of the unitary IC leads so as to be brought into pressure contact with the lower surface portion, and a second unitary contact extending to a side surface portion of the lead so as to be brought into pressure contact with the side surface portion. The first and second unitary contacts have male terminals separately connected to a wiring board, respectively.

According to the present invention, the first unitary contact is brought into pressure contact with the lower surface portion of the single lead and the second unitary contact is brought into pressure contact with the side surface portion of the lead. In this way, the composite contact is brought into pressure contact with the single IC lead at a plurality of points, and the first and second unitary contacts are muturally complementing to ensure the reliability of contact between each contact and each IC lead.

Furthermore, the composite contact can be connected to the wiring board at the first and second unitary contacts which are capable of contacting the single lead at a plurality of points, through the male terminals separately provided for the first and second unitary contacts. Accordingly, possible inferior contact of one unitary contact at the soldered area of connection with respect to the through-hole of the wiring board or with respect to the wiring pattern can be complemented (or made up for) by the other unitary contact. As a result, reliability of contact can be better ensured. In addition while exhibiting the above functions, there can also be ensured the retaining function of the IC package by the sidewardly-directed force of the first unitary contact. As a result, there can be provided an IC package socket which can be properly brought into contact with the DIP type IC package, the gull wing type IC package, and the J-bend type IC package.

The above and other objects and features of the present invention will become more apparent from the following detailed description with reference to the accompanying drawings.

BRIEF DESCRIPTION OF THE DRAWINGS

FIG. 9 is a side view of the second unitary contact;

FIG. 10 is a side view of a half part of a gull wing type IC package;

FIG. 11 is a side view of a half part of a J-bend type IC package; and

FIG. 12 is a side view of half of an IC package having a lead made of an electrically conductive foil.

DETAILED DESCRIPTION OF THE EMBODIMENTS

Embodiments of the present invention will be described hereinafter with reference to FIGS. 1 through 11 inclusive.

Figure 4:
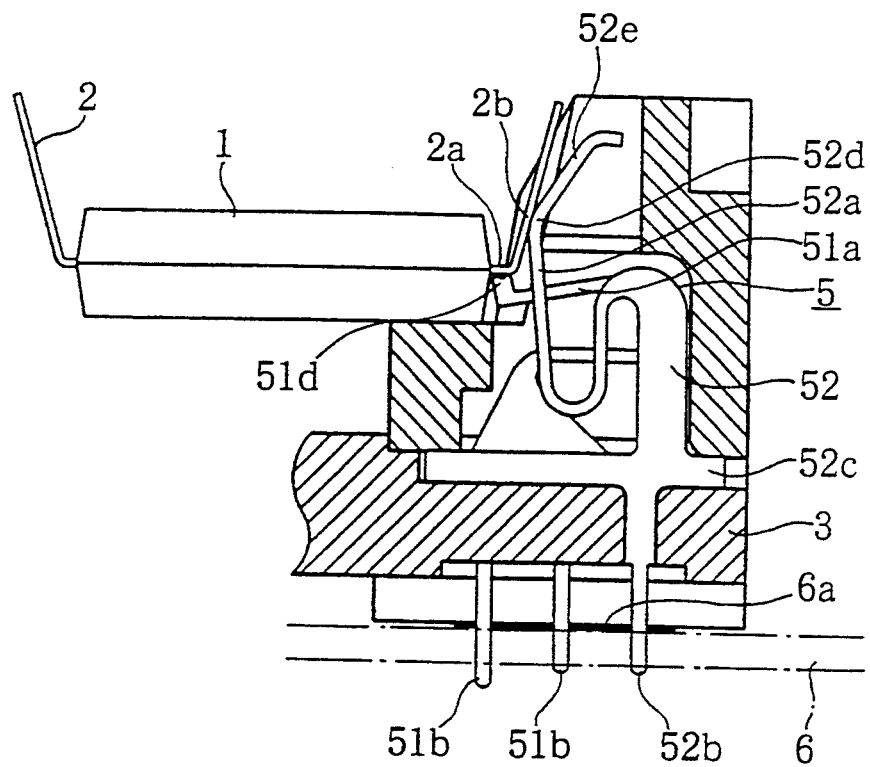
FIG. 4 is a sectional view taken on line 3—3 of the above IC socket but with an IC package received therein.

Any of a DIP type IC package (Dual-In-Line type package), a gull wing type IC package, and J-bend type IC package have bend-shaped IC leads arranged in array along side surfaces of an IC package body. Based on the bending shapes of the IC leads, the IC leads are classified into the types mentioned above. As shown in FIG. 4, for example, the IC lead 2 of a DIP type IC package of FIG. 4 has a portion projecting sidewardly from the side surface of the IC package body, and a portion bent in an L-shape and extending from that portion.

As shown in FIG. 10, the gull wing type IC package 1 has a portion obtained by further bending a distal end of the above DIP type IC package sideways to form a further L-shape. Similarly, as shown in FIG. 11, the J-bend type IC package 1 has an IC lead 2 which is bent toward a lower surface of an IC package body from a side surface thereof to form a J-shape. Similarly, as shown in FIG. 12, the IC package 1 has an IC lead 2 which is formed of an electrically conductive foil extending from a side surface of the IC package to a lower surface thereof to form an L-shape and which is intimately attached to the side surface and the lower surface.

Any of the above types of IC packages has a portion 2a forming the lower surface and a portion 2b forming the side surface when viewed in the condition that the IC package is inserted in the socket. The present invention provides a socket which is favorably applied to any of the above types of IC packages.

The DIP type IC package has a wide portion 2c at the bend portion of the IC lead 2 and a narrow portion at the distal end portion. The present invention utilizes this wide portion of the IC lead as a contacting structure with a satisfactory result.

Figure 1:
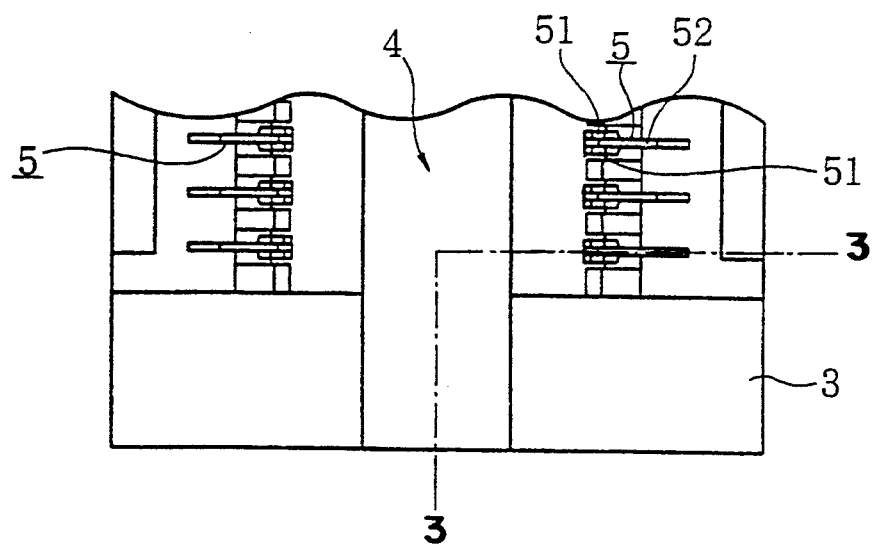
FIG. 1 is a plan view showing a part of an IC socket according to one embodiment of the present invention.

As shown in FIG. 1, the socket 3 has an IC receiving portion 4 and a large number of contacts arranged in array along two or four sides thereof in such a manner as to correspond to the IC leads 2.

Each contact 5 comprises a composite contact which has a first unitary contact (or contact member) 51 and a second unitary contact (or contact member) 52 which are capable of contacting a single IC lead 2 at a plurality of points. The first unitary contact 51 constituting the composite contact extends to the lower surface portion 2a of the single IC lead 2 in order to contact the lower surface portion under pressure, while the second unitary contact 52 extends to the side surface portion 2b of the single IC lead 2 in order to contact the side surface portion under pressure.

Figure 8:
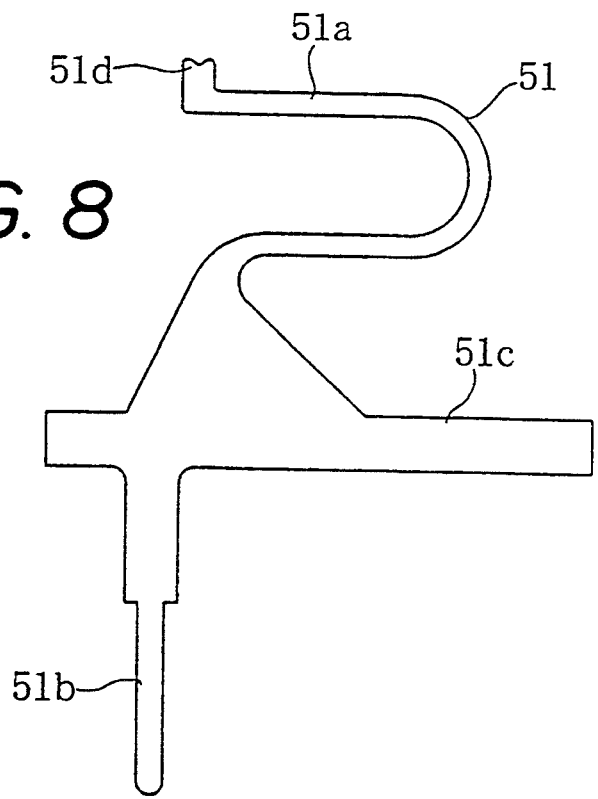
FIG. 8 is a side view of the first unitary contact.

For example, the DIP type IC package has the wide portion 2c at the bend portion as mentioned above, and the first unitary contact 51 is brought into pressure contact with the lower surface portion 2a of this wide portion 2c with an upwardly-directed force $P_1$, and the second unitary contact 52 is brought into pressure contact with the side surface portion 2b of this wide portion 2c with a sidewardly-directed force $P_2$. As shown in FIG. 8, as one example, the first unitary contact portion 51 includes at an upper portion thereof a contact element 51a which extends horizontally and is elastically shiftable upwardly and downwardly, and at a lower portion thereof a male terminal 51b adapted to a mount the socket on a wiring board 6 through a through-hole or a surface. The first unitary contact 51 further includes a support portion 51c extending horizontally at an area of connection between the contact element 51a and the male terminal 51b.

Figure 5:
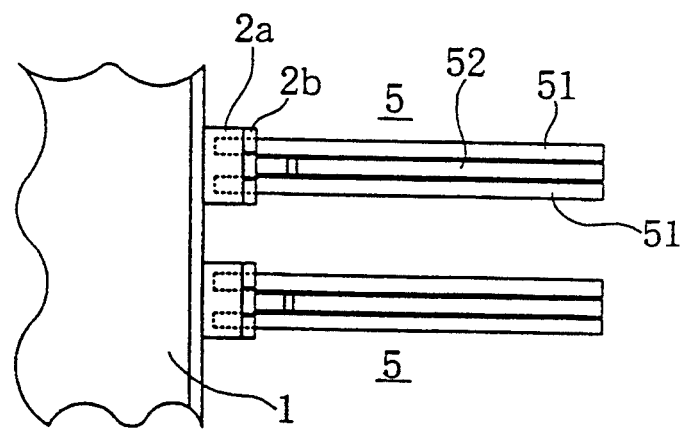
FIG. 5 is a plan view showing a contacting condition between IC leads and composite contacts in the above IC socket, as well as an arrangement of first and second unitary contacts.
Figure 6:
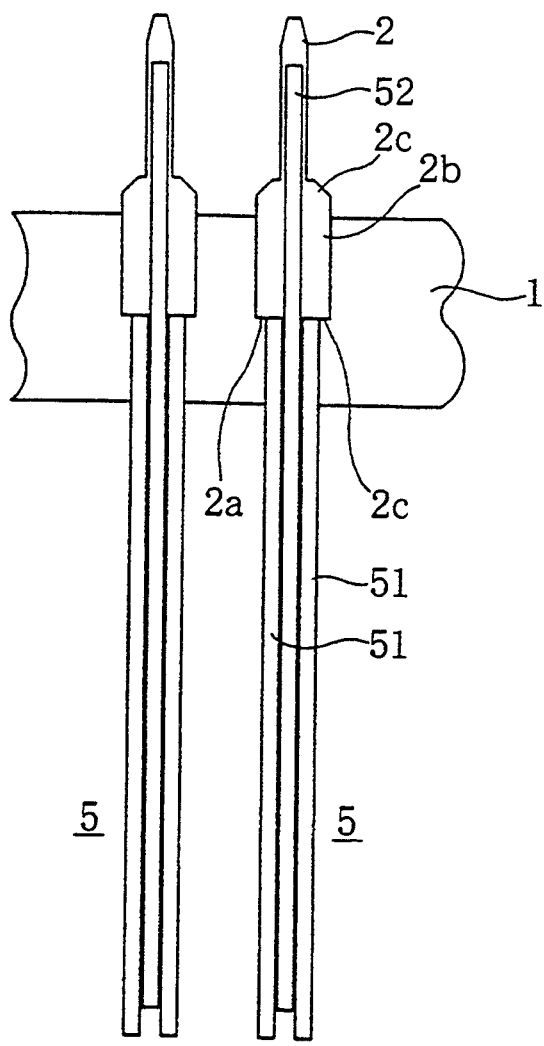
FIG. 6 is a side view of FIG. 5.

The first unitary contact 51 is implanted in the socket 3 through the male terminal 51b. For this purpose, a distal end portion of the male terminal 51b projecting from a lower surface of the socket 3 is inserted into the through-hole of the wiring board 6 and adhered thereto by soldering (see FIG. 4), or otherwise the distal end portion of the male terminal 51b is bent into an L-shape (not shown) and this L-shaped portion is adhered to a wiring pattern formed on the surface of the wiring board 6 by soldering and the contact element 51c is stably supported by the support portion. As shown in FIGS. 4 to 6, the contact element 51a extends to the lower surface portion of the IC lead 2, and a projection 51d formed on a distal end of the contact element 51a is brought into pressure contact with the lower surface portion 2a of the IC lead 2 with the upwardly-directed force $P_1$.

In the case of the DIP type IC package, the first unitary contact 51 is brought into pressure contact with the lower surface portion 2a of the wide portion 2c of the IC lead 2 under the upwardly-directed force through the contact element 51a.

On the other hand, as shown in FIG. 9, the second unitary contact 52 includes at an upper portion thereof a contact element 52a extending upwardly beyond a basal portion of the contact element 51a and capable of elastically shifting forwardly and backwardly, and at a lower portion thereof a male terminal 52b for mounting the socket on the wiring board 6 through a through-hole or through a surface. The second unitary contact 52 further includes a support portion 52c at an area of connection between the contact element 52a and the male terminal 52b and extending horizontally.

The functions of the male terminal 52b and the support portions 52c of the second unitary contact 52 are the same as those of the male terminal 51b of the first unitary contact 51. The contact element 52a extends upwardly of the contact element 51a along an outer side surface of the IC lead 2, and as shown in FIGS. 4 to 6, a protrusion 52d formed at a distal end of the contact element 52 or in the vicinity of the distal end is brought into pressure contact with the side surface portion 2b of the IC lead 2 with the sidewardly-directed force $P_2$. The distal end portion of the contact element 52a is inclined outwardly to form a guide element 52e for guiding the introduction of the IC lead 2. The first and the second unitary contacts 51 and 52 are separately implanted in the socket 3 and inserted into different through-holes of the wiring board 6 and soldered (i.e. the first and second unitary contacts 51, 52 are separate and discrete from one another).

As shown in FIGS. 1 to 6 inclusive, the contact 5 is composed of a pair of first unitary contacts 51 and a single second unitary contact 52 (i.e. contact 5 is a "composite contact"). The first unitary contacts 51 have similar shapes. As shown in FIGS. 5 and 6, the two elastic contact elements 51a extend in parallel relation toward the lower surface portions 2a and are brought into pressure contact with the IC lead 2 with the upwardly-directed force $P_1$, respectively. In the case of the DIP type IC package, the two contact elements 51a of the pair of first unitary elastic contacts 51 are brought into pressure contact with the lower surface of the wide portion 2c. On the other hand, the second unitary elastic contact 52 is disposed between the pair of first unitary contacts 51 placed in parallel relation. In the second unitary elastic contact 52, the contact element 52a extends to the side surface portion 2b of the IC lead 2 from that position and the protrusion 52d is brought into pressure contact with a central portion of the IC lead 2 with the sidewardly-directed force $P_2$. In the case of the DIP type IC package, the contact element 52a of the second unitary contact 52 is brought into pressure contact with a central portion of the side surface of the wide portion 2c. Specifically again, the pair first unitary contacts 51 are arranged in symmetrical relation with respect to the second unitary contact 52 and adjacent to each other such that their side surfaces are opposite to each other. As a result, each protrusion 51d of the pair of first unitary contacts 51 is brought into contact with the lead 2 at a position corresponding to each bottom point of an isosceles triangle, while the protrusion 51d of the second unitary contact 52 is brought into contact with the lead 2 at a position corresponding to a vertex of the triangle.

The first and second unitary contacts 51 and 52 are disposed adjacent to each other so that side surfaces thereof are in contact with each other to provide an electrically conductive condition between the first and second unitary contacts 51, 52. More specifically, the first and second unitary contacts 51 and 52 are brought into contact with each other chiefly at the side surfaces of their support portions 51c, 52c, and also the side surfaces of the contact elements 51a and 52a contact one another at points where they cross one another (e.g. see FIG. 4).

Figure 7:
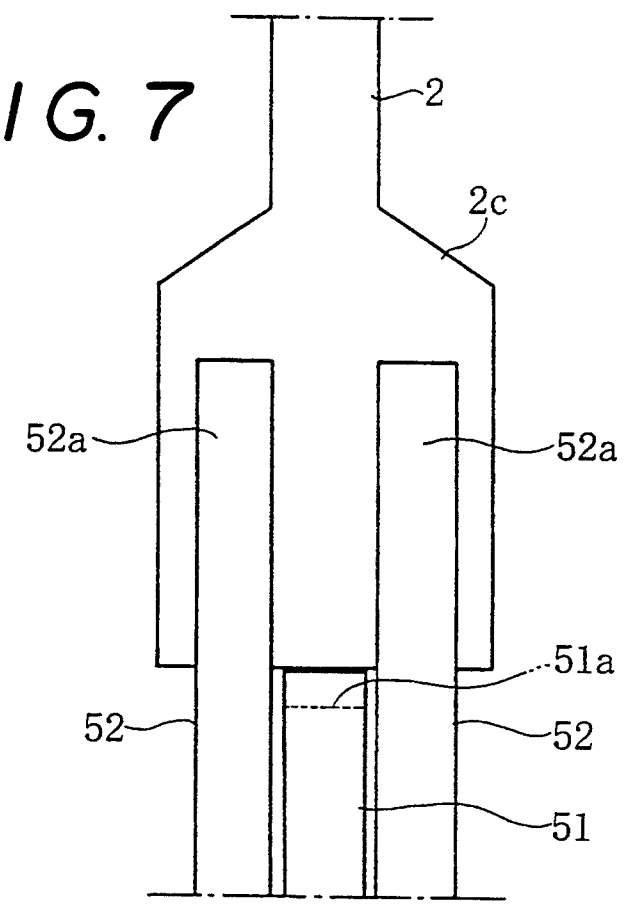
FIG. 7 is a side view showing a contacting condition between IC leads and composite contacts in an IC socket according to another embodiment of the present invention.

According to the present invention, the first and second unitary contacts 51 and 52 can be disposed adjacent to and so that their side surfaces are in mutual contact. As shown in FIG. 7, the composite contact 5 may comprise a pair of second unitary contacts 52 and a single first unitary contact 51. The second unitary contacts 52 resemble one another. The single first unitary contact 51 is disposed between the pair of second unitary contacts 52 such that the second unitary contacts 52 are in symmetrical relation with respect to the first unitary contact 51. The contact elements 52a of the pair of second unitary contacts 52 extend in parallel relation to each other along the side surface portion 2b of the IC lead 2 and are brought into pressure contact with the side surface portion 2b at the two protrusions 52d with the sidewardly-directed force $P_2$, while the contact element 51a of the first unitary contact 51 extends toward the lower surface portion 2a of the IC lead 2 from the pair of second unitary contacts 52 and is brought into pressure contact with the central portion of the lower surface portion 2a at the protrusion with the upwardly-directed force $P_1$. Accordingly, each protrusion 52d of the pair of second unitary contacts 52 is brought into contact with the IC lead 52 at a position corresponding to each bottom corner of the isosceles triangle, while the protrusion 51d of the first unitary contact 51 is brought into contact with the IC lead at a position corresponding to the vertex of the triangle.

Figure 2:
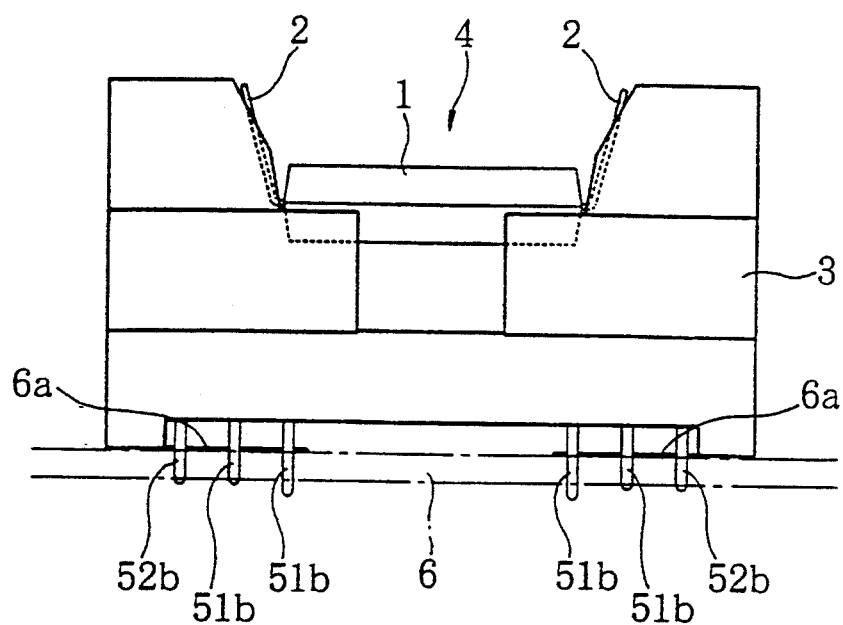
FIG. 2 is a side view of the IC socket of FIG. 1.
Figure 3:
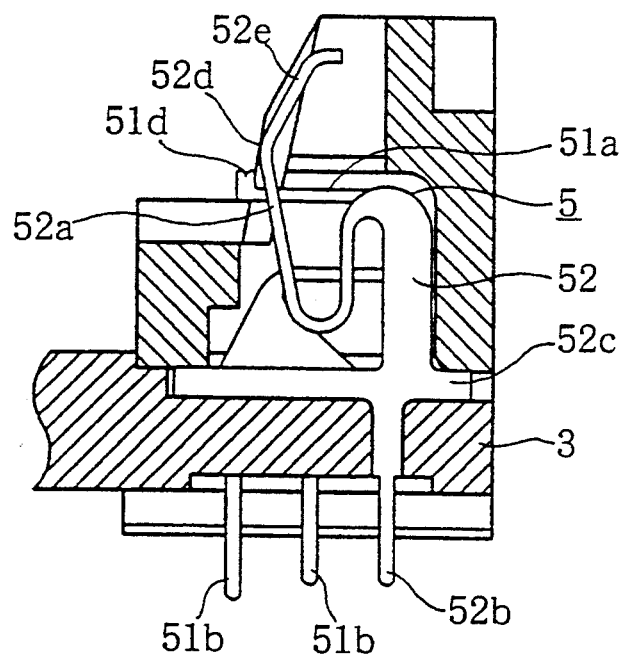
FIG. 3 is a sectional view taken on line 3—3 of FIG. 1.

Each contact 5 is constructed in a composite structure by the first and second unitary contacts 51 and 52 as hereinbefore described, and a plurality of such contacts 5 are arranged, as shown in FIG. 1, in array along two or four opposing sides of the IC receiving portion 4. As shown in FIGS. 2 and 4, the contacts 5 are inserted at the male terminals 51b and 52b respectively into separate through-holes formed in the wiring board 6 and soldered to a short-circuit conductive body 6a formed on the surface of the wiring board 6 and adapted to short-circuit the male terminals 51b and 52b through the conductive body 6a and further short-circuit the first and second contacts 51 and 52. By this arrangement, the IC leads 2 are connected to the wiring board by the first and second unitary contacts 51 and 52, respectively.

As described above, according to the present invention, the first unitary contact capable of contacting the lower surface portion of a single lead and the second unitary contact capable of contacting the side surface portion of the lead are mutually complementing so as to contact the IC leads at a plurality of points respectively, thus ensuring a reliable contact with the contacts.

Since the composite contact is brought into contact with the single lead at the plurality of points and is connected to the wiring board through the first and second unitary contacts constituting the composite contact, possible inferior contact of one unitary contact at the soldered area of connection with respect to the through-hole or with respect to the wiring pattern can be complemented by the other unitary contact. As a result, a reliable contact is further enhanced.

In addition, while exhibiting the above effect, there can be obtained a retaining function of the IC package by the sidewardly-directing force of the first unitary contact. As a result, there can be provided an IC package socket which can be properly brought into contact with the DIP type IC package, the gull wing type IC package, and the J-bend type IC package.

While the present invention has been described in the form of preferred embodiments, it should of course be understood that the invention is not limited to these embodiments but various changes and modifications can be made without departing from the scope of the present invention as defined by the appended claims.

What is claimed is:

1. A socket for an IC package having a plurality of leads, said socket comprising:
   a socket base having an IC package receiving portion for receiving the IC package;
   a plurality of contacts mounted to said socket base and being arranged to respectively contact the leads of the IC package when the IC package is received in said IC package receiving portion of said socket base;
   wherein each of said contacts comprises a first unitary contact member which constitutes a means for contacting and pressing upwardly against a lower surface of a respective one of the leads of the IC package, and a second unitary contact member which constitutes a means for contacting and pressing inwardly against a side surface of the respective one of the leads in a direction toward the IC package when the IC package is received in said IC package receiving portion;
   wherein said first unitary contact member of each of said contacts has a male terminal extending through a surface of said socket base and adapted to connect to a wiring board;
   wherein said second unitary contact member of each of said contacts has a male terminal extending through a surface of said socket base and adapted to connect to the wiring board separately from said male terminal of said first unitary contact member; and wherein said first unitary contact member of each of said contacts is separate and discrete from said second unitary contact member of each of said contacts, respectively.

2. A socket for an IC package as claimed in claim 1, wherein each of said contacts has a pair of first unitary contact members.

3. A socket for an IC package as claimed in claim 1, wherein each of said contacts has a pair of first unitary contact members, and, for each of said contacts, said second unitary contact member is disposed between said pair of first unitary contact members.

4. A socket for an IC package as claimed in claim 3, wherein, for each of said contacts, said pair of first unitary contact members are arranged in a symmetrical relation with respect to said second unitary contact member.

5. A socket for an IC package as claimed in claim 1, wherein each of said contacts has a pair of second unitary contact members.

6. A socket for an IC package as claimed in claim 1, wherein each of said contacts has a pair of second unitary contact members, and, for each of said contacts, said first unitary contact member is disposed between said pair of second unitary contact members.

7. A socket for an IC package as claimed in claim 6, wherein said pair of second unitary contact members are arranged in a symmetrical relation with respect to said first unitary contact member.

8. A socket for an IC package as claimed in claim 1, 2, 3, 4, 5, 6 or 7, wherein, for each of said contacts, said first unitary contact member and said second unitary contact member are adjacent to one another along a direction normal to an inward direction in which the second unitary members respectively press against the side surfaces of the leads of the IC package when the IC package is received in the IC package receiving portion.

9. A socket for an IC package as claimed in claim 1, 2, 3, 4, 5, 6 or 7, wherein, for each of said contacts, said first unitary contact member and said second unitary contact member are in contact with each other at side surfaces thereof.

10. A socket for an IC package having a plurality of leads, said socket comprising:

a socket base having an IC package receiving portion for receiving the IC package;

a plurality of contacts mounted to said socket base and being arranged to respectively contact the leads of the IC package when the IC package is received in said IC package receiving portion of said socket base;

wherein each of said contacts comprises a first unitary contact member which constitutes a means for contacting and pressing upwardly against a lower surface of a respective one of the leads of the IC package, and a second unitary contact member which constitutes a means for contacting and pressing inwardly against a side surface of the respective one of the leads in a direction toward the IC package when the IC package is received in said IC package receiving portion;

wherein said first unitary contact member of each of said contacts has a male terminal extending through a surface of said socket base and adapted to connect to a wiring board;

wherein said second unitary contact member of each of said contacts has a male terminal extending through a surface of said socket base and adapted to connect to the wiring board separately from said male terminal of said first unitary contact member; and wherein each of said contacts has a pair of first unitary contact members.

11. A socket for an IC package as claimed in claim 10, wherein each of said contacts has a pair of first unitary contact members, and, for each of said contacts, said second unitary contact member is disposed between said pair of first unitary contact members.

12. A socket for an IC package as claimed in claim 11, wherein, for each of said contacts, said pair of first unitary contact members are arranged in a symmetrical relation with respect to said second unitary contact member.

13. A socket for an IC package as claimed in claim 10, wherein, for each of said contacts, said first unitary contact member and said second unitary contact member are adjacent to one another along a direction normal to an inward direction in which the second unitary members respectively press against the side surfaces of the leads of the IC package when the IC package is received in the IC package receiving portion.

14. A socket for an IC package as claimed in claim 10, wherein, for each of said contacts, said first unitary contact member and said second unitary contact member are in contact with each other at side surfaces thereof.

15. A socket for an IC package having a plurality of leads, said socket comprising:

a socket base having an IC package receiving portion for receiving the IC package;

a plurality of contacts mounted to said socket base and being arranged to respectively contact the leads of the IC package when the IC package is received in said IC package receiving portion of said socket base;

wherein each of said contacts comprises a first unitary contact member which constitutes a means for contacting and pressing upwardly against a lower surface of a respective one of the leads of the IC package, and a second unitary contact member which constitutes a means for contacting and pressing inwardly against a side surface of the respective one of the leads in a direction toward the IC package when the IC package is received in said IC package receiving portion;

wherein said first unitary contact member of each of said contacts has a male terminal extending through a surface of said socket base and adapted to connect to a wiring board;

wherein said second unitary contact member of each of said contacts has a male terminal extending through a surface of said socket base and adapted to connect to the wiring board separately from said male terminal of said first unitary contact member; and wherein each of said contacts has a pair of second unitary contact members.

16. A socket for an IC package as claimed in claim 15, wherein each of said contacts has a pair of second unitary contact members, and, for each of said contacts, said first unitary contact member is disposed between said pair of second unitary contact members.

17. A socket for an IC package as claimed in claim 16, wherein said pair of second unitary contact members are arranged in a symmetrical relation with respect to said first unitary contact member.

18. A socket for an IC package as claimed in claim 15, wherein, for each of said contacts, said first unitary contact member and said second unitary contact member are adjacent to one another along a direction normal to an inward direction in which the second unitary members respectively press against the side surfaces of the leads of the IC package when the IC package is received in the IC package receiving portion.

19. A socket for an IC package as claimed in claim 15, wherein, for each of said contacts, said first unitary contact member and said second unitary contact member are in contact with each other at side surfaces thereof.

* * * * *